United States Patent [19]

Yu et al.

[11] Patent Number: 5,303,350
[45] Date of Patent: Apr. 12, 1994

[54] CIRCUIT FOR INITIALIZING REGISTERS USING TWO INPUT SIGNALS FOR WRITING DEFAULT VALUE INTO D-LATCH AFTER A RESET OPERATION

[75] Inventors: Chieh-Chih Yu; Hugn-Chyuan Hsieh, both of Taipei, Taiwan

[73] Assignee: Acer Incorporated, Taiwan

[21] Appl. No.: 632,172

[22] Filed: Dec. 20, 1990

[51] Int. Cl.$^5$ ............................................. G06F 13/00
[52] U.S. Cl. .................................. 395/275; 307/272.1;
364/246.91; 364/248.6; 364/251.4; 364/260.8;
364/271.5; 364/DIG. 1; 364/950.4; 364/964;
395/800
[58] Field of Search ................................ 395/800, 275;
307/272.1

[56] References Cited

U.S. PATENT DOCUMENTS

| | | | |
|---|---|---|---|
| 3,979,732 | 9/1976 | Hepworth et al. | 395/325 |
| 4,384,326 | 5/1983 | Devchoudhury | 395/425 |
| 4,631,659 | 12/1986 | Hayn, II et al. | 395/325 |
| 4,789,963 | 12/1988 | Takahashi et al. | 395/325 |
| 4,929,850 | 5/1990 | Breuninger | 307/272.1 |
| 5,036,221 | 7/1991 | Brucculeri et al. | 307/443 |
| 5,051,610 | 9/1991 | Terane et al. | 307/272.1 |
| 5,072,132 | 12/1991 | Samaras et al. | 307/272.1 |
| 5,142,688 | 8/1992 | Harwood, III | 395/800 |

OTHER PUBLICATIONS

Greenfield and Wray, "Using Microprocessors and Microcomputers: The 6800 Family," Wiley, New York, 1981.
NEC Corporation, Block of Library of CMOS-4/-4A/4R Family (Rev. 1), 1986.
Gerry Kane, "CRT Controller Handbook," Osborne/McGraw-Hill, Berkeley, Calif., 1980.

Primary Examiner—Lawrence E. Anderson
Assistant Examiner—Meng-Ai T. An
Attorney, Agent, or Firm—Townsend & Townsend Khourie and Crew

[57] ABSTRACT

A circuit for initializing a D-latch of an input/output system. The circuit comprises first and second logic means, the first logic means generating an enable signal coupled to the clock input of the D-latch which changes state from inactive to active at a first time t1 and again at a subsequent time t2, in response to the system write control signal addressed to the D-latch and the system reset signal. The second logic means generates a local data signal, in response to the system reset signal and system data signal, to the data input of the D-latch. The D-latch is reset substantially at time t1 and the system data signal is strobed in the D-latch substantially at time t2.

9 Claims, 2 Drawing Sheets

CIRCUIT FOR INITIALIZING REGISTERS USING TWO INPUT SIGNALS FOR WRITING DEFAULT VALUE INTO D-LATCH AFTER A RESET OPERATION

FIELD OF INVENTION

This invention relates to control of register of a data processing system; in particular, the control circuit for registers which may be written into a default value after a reset operation.

BACKGROUND ART

In most modern computer systems, the input or output device is typically controlled by a central processing unit through an input/output controller. For instance, FIG. 1 shows how an output device, such as a monitor 5, is controlled by a central processing unit (CPU) 1.

In FIG. 1, video controller 2 and screen random access memory (RAM) 3 are coupled to the CPU 1 through address, data and control buses 6. The CPU sends to the screen RAM 3 data to be displayed The screen RAM 3 receives the address and data signals from the CPU 1 so that the CPU 1 can change the screen image as expected. The CPU sends control signals and some basic display parameter data signals to the video controller 2 to control the display of the monitor 5. The video controller 2 operates in accordance with the commands of the CPU 1 and, through the address, control and data buses 10, causes the data signal 8 of the screen RAM 3 to be transmitted to processing logic 4. The processing logic 4 is controlled by the control signal 7, such as horizontal synchronize and vertical synchronize signals, from the video controller 2. The monitor 5 receives the data signals 9 from the processing logic 4 and displays the data as a result of the control signal 7. Furthermore, if the screen RAM 3 is a dynamic random access memory (DRAM), the video controller 2 also refreshes the DRAM through the buses 10 to keep intact the stored data in the screen RAM 3.

The video controller 2 includes at least a plurality of registers that must be initialized by the CPU 1. The CPU 1 communicates with the registers through the data bus. These registers hold basic system parameters such as the number of horizontal lines for each character row, number of lines per field, the cursor location, and whether interlaced or non interlaced scan is desired, etc. These default values of the parameters are written into the registers of the video controller 2 by the CPU 1 after the completion of the reset step of the system. If the user of the system desires a display mode different from that of the default values, he may input the desired values of the parameter into the registers to change the display mode. These parameters control the operation of the video controller 2, thus making it produce the desired screen display on the monitor 5. More detailed descriptions of the video controller may be found in the book of Gerry Kane, CRT Controller Handbook, Osborne/McGraw-Hill, Berkeley, Calif, 1980.

For some other input/output controllers which have several modes of operation, the particular mode in use at any time is also determined at least by the bits in a command or status register which is included in the input/output controller. The command register is written to by the CPU, so that the CPU can command the input/output controller to operate in a given mode, and the CPU can change these commands as the program progresses. The status register is written into by an external device. It contains the information about the status of the external device such as if the printer is out of paper, if the tape drive needs another character, and so on. The CPU can read the status register to monitor the progress of data transfers and take appropriate action when required. A complete discussion on the peripheral interface controller can be found in the book, "Using Microprocessors and Microcomputers: The 6800 Family" by Greenfield and Wray, Wiley, N.Y., 1981.

In general, the above described input/output registers of the input/output controller are first reset after the power-on of the system. In most cases, the CPU generates a RESET signal to each bit of the registers while resetting. The input/output controller needs this reset step to function as expected. Afterwards, the CPU writes the default value into the input/output register to begin a default mode of operation of the input/output device. The input/output register may contain 1 bit or more of bits, depending on the requirement and complexity of the system.

In general, the input/output register is made of flip-flops and each bit of the register contains one flip-flop. In conventional design, the D type flip-flop (D-FF) with reset shown in FIG. 2 is implemented in the registers of the input/output controller. The operation of a D-FF with reset may be found in any digital design literature. The timing of the signals in FIG. 2 may be found in FIG. 4. In FIG. 2, the Clock (C) pin is connected to the system write signal XWJ which in our example is an active low signal. The D pin is connected to the system DATA signal. The reset pin is connected to the RESET signal which is generated from the electronic data processing system. In our example the system reset signal RESET is active low. The QQ output is low during the time RESET signal is low for reset purpose and remains low afterwards until the positive-going edge of the system write XWJ signal, at which time the data is strobed in and then latched by the D-FF.

In the prior art, each different input/output device, in general, has its own input/output controller in form of an integrated circuit(IC). However, it has been a recent trend that all input/output controller circuits are integrated on a single integrated circuit to miniaturize the data processing system. This is sometimes called the super input/output controller system. Since all input/output controller systems have been integrated on a single integrated circuit, it is not surprising that there may be several hundred of the above mentioned input/output registers. This results, on the average, in several thousand D-FF's with reset on a single integrated circuit. Therefore, a substantial amount of cell area is occupied by the input/output registers.

It is therefore one objective of the instant invention to reduce the chip cell area occupied by the input/output registers by providing a control circuit together with the implementation of a D-latch instead of the conventional D-FF with reset.

SUMMARY OF THE INVENTION

A control circuit for use with registers of an electronic data processing system has been provided. The registers are reset by a system reset signal from the electronic data processing system after the completion of the power-on of the electronic data processing system. The electronic data processing system outputs a system write control signal and a system data signal while accessing the register. The register has a plurality of D-latches, and each D-latch has a data input, a clock input and a data output.

The control circuit of this invention comprises: a first logic means and a second logic means. The first logic means generates an enable signal, which is coupled to the clock input of the D-latch, and is active after a first time t1 and again after a subsequent second time t2, in response to the system write control signal addressed to the D-latch and the system reset signal. The second logic means generates a local data signal in response to the system reset signal and the system data signal, which is coupled to the data input of the D-latch. The D-latch is reset after time t1 and then the system data signal is strobed in the D-latch after time t2.

A single D-latch occupies less chip cell area than a single D type flip-flop with reset. As a result, while several thousands of flip-flop have been implemented in the registers of the data processing system, there is a substantial saving in the chip area, compared with conventional design, when the instant invention is implemented with D-latches in the data processing system.

DETAILED DESCRIPTION OF THE PREFERRED EMBODIMENT

As described above there is a need to reduce the cell area occupied by the input/output registers of a fully integrated input/output controller which has several thousands of flip-flop with reset thereon.

It has been found that a D-latch uses less cell area than the D type flip flop with reset. For, instance, the "Block Library of CMOS-4/4A/4R Family (Rev.1), NEC Corporation, 1986" (See Appendix A) indicates that a D-type Flip-Flop with Reset set, such as Block type F617, uses 7 cells while that D-type latch, such as Block type F601 uses only 3 cells. The replacement of a single flip-flop with reset by the single D latch does not mean a lot. However, when there are thousands of flip-flops to be substituted by D-latch, this is a substantial saving of the chip cell area.

A simple substitution of the D type flip-flop with reset by a D-latch does not complete this invention. Usually the D type flip flop must be reset first after the power-on of the system. Then, the central processing system will write a set of default values of the parameters of the input/output controller into these flip-flops to control the operation of the controller. To accomplish this function, no control circuit is needed when a D-type flip flop with reset is provided. To use the D-latch, a control circuit has to be provided to achieve the reset function followed by the write function of the default values.

Figure 3:
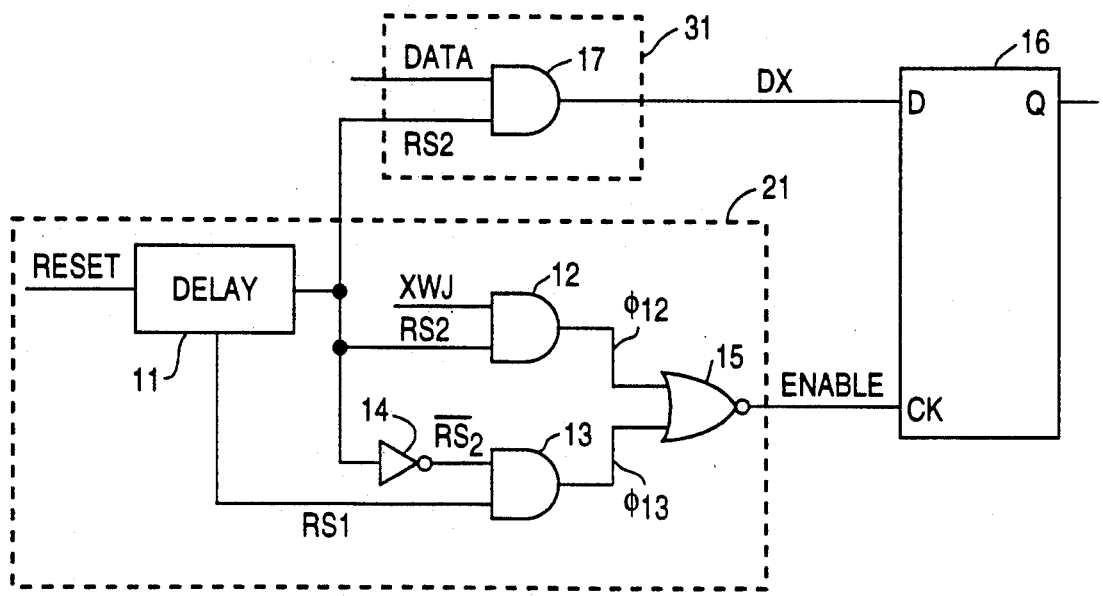
FIG. 3 shows a D-latch together with a control circuit utilized in the input/output register in accordance with the instant invention.

Referring to the FIG. 3, one bit D-latch along with the control circuit of the instant invention is shown.

The control circuit in FIG. 3 comprises first logic means 21 and second logic means 31. The first logic means 21 comprises a delay circuit 11 and other logic gates as shown. The delay circuit 11 has an input, a first output and second output. The system reset signal is coupled to the input and the delay circuit 11 generates a first local reset signal RS1 at the first output of the delay circuit by delaying the input system reset signal for a first predetermined time delay td1. The delay circuit also generates a second local reset signal RS2 at the second output of the delay circuit 11 by delaying the input system reset signal for a second predetermined time delay td2. The time delay td1 is less than time delay td2 in our embodiment. The time delay td1 may also be substantially equal to zero.

The first logic means 21 also comprises a first AND gate 12 and a second AND gate 13 as shown. The first AND gate 12 has a first input, a second input and one output. The system write control signal XWJ is coupled to the first input and the second local reset signal RS2 is coupled to the second input of the AND gate 12. The second AND gate 13 has first, second input and one output. The second local reset signal RS2 is input to an inverter 14, the output of which is coupled to the first input of second AND gate 13. The first local reset signal RS1 is coupled to the second input of the AND gate 13. The output of the first and second AND gate 12, 13 are coupled to the input of a NOR gate 15 output of which is a enable signal and coupled to the clock input of the D-latch 16.

The second logic means 31 comprises an AND gate 17. The inputs of the AND gate 17 are coupled to the system data signal and the second local reset signal RS2 respectively. The output of the AND gate 17 is coupled to the data D input of the D latch 16.

Figure 1:
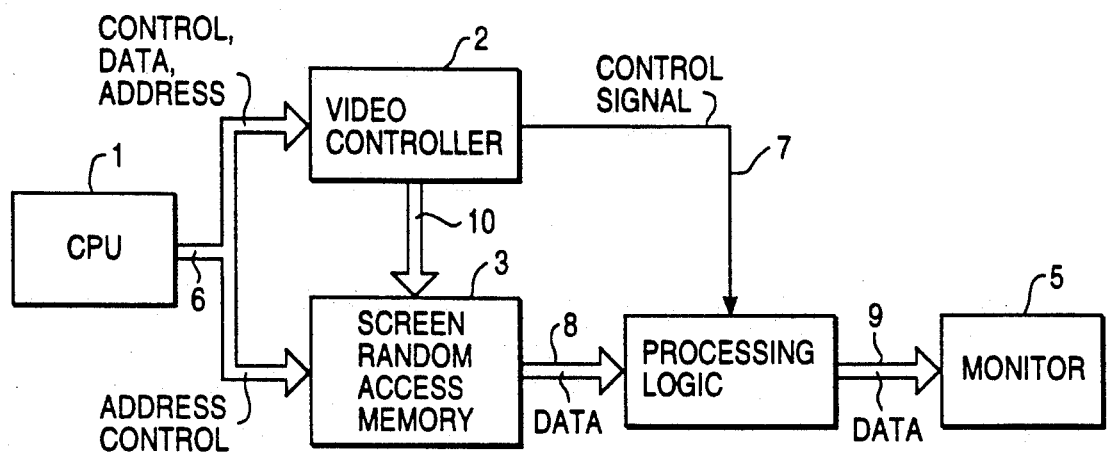
FIG. 1 shows a data processing system incorporating a conventional video subsystem.
Figure 2:
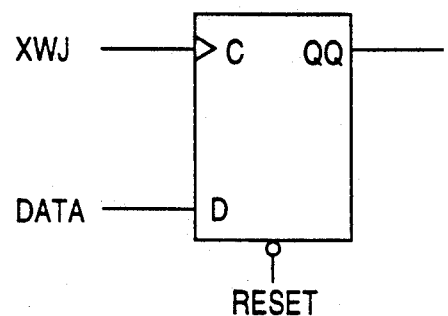
FIG. 2 shows a D type flip-flop with reset utilized in the input/output register in accordance with the conventional design.
Figure 4:
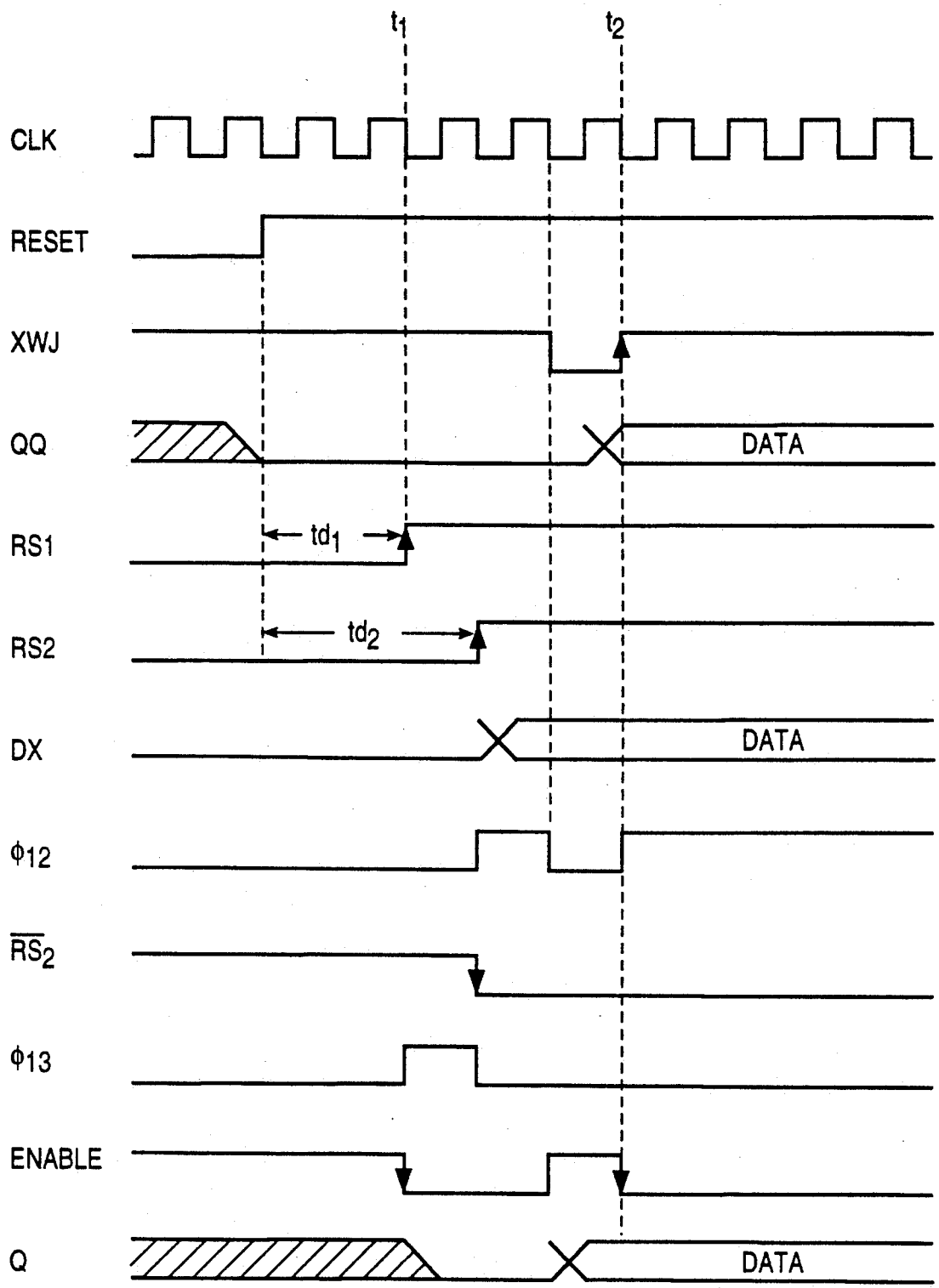
FIG. 4 is a timing chart of the signals in FIG. 2 and FIG. 3.

The timing chart of FIG. 3 and FIG. 2 are disclosed together in FIG. 4. In our embodiment, the local reset signals RS1 and RS2 are active low. The system write control signal is active low. It may be found that after time point t1 the enable signal is low which resets the D-latch 16. The enable signal is low again after time point t2, in response to the system write control signal XWJ, which will write a default value into the D-latch 16. The above function, which is achieved by D type flip-flops with reset in conventional design, may be accomplished by the instant invention which results a substantial saving of cell area when thousands of flip-flops are needed in a input/output controller as described.

Although this invention has been described in reference to the Input/Output register of the Input/Output controller in a data processing system, it must be understood that the principle of this invention may be well applied to any data processing system including registers into which are written a set of values after a reset operation.

It must be also understood that above description on this invention are intended for illustration and not for restrictive purpose. Many modifications, substitutions and variations are possible to persons reasonably skillful in this art which are still within the intended scope of protection of this invention. For instance, the local reset signal RS1, RS2 or system write control signal may be active high in other embodiments and the function of this invention may still be achieved through simple substitution or rearrangements of the logic gates involved in the first and second logic means 21, 31. The following appended claims and their equivalence is deemed to be the scope of this invention.

We claim:

1. A circuit for initializing a register of an input/output system, formed on a single integrated circuit chip, said register being reset by a system reset signal from an electronic data processing system after completion of power-on of the electronic data processing system, the electronic data processing system outputting a system write control signal and a system data signal while writing a default value of data to the register, the register having at least one D-latch, said D-latch having a data input, a clock input and a data output, the circuit comprising:

a first logic means for generating an enable signal which is coupled to the clock input of the D-latch, said enable signal changing state from inactive to active at a first time t1 and from inactive to active again at a subsequent time t2, in response to the system write control signal addressed to the D-latch and the system reset signal;

a second logic means for generating a local data signal, having as inputs the system reset signal and the system data signal, any an output coupled to the data input of the D-latch;

wherein the D-latch is reset at substantially time t1, and the system data signal is strobed in the d-latch at substantially time t2 while the D-latch is addressed by the electronic data processing system.

2. The circuit in accordance with the claim 1, wherein the first logic means comprising:

a delay circuit, the delay circuit having an input, a first output and second output, the system reset signal being coupled to the input, the delay circuit generating a first local reset signal at the first output of the delay circuit by delaying the system reset signal for a first predetermined time delay td1, the delay circuit generating a second local reset signal at the second output of the delay circuit by delaying the system reset signal for a second predetermined time delay td2;

a first AND gate, the AND gate having first input, second input and one output, the first input being coupled to the system write control signal, the second input being coupled to the second local reset signal;

a second AND gate, the AND gate having first input, second input and one output, the first input being coupled to the second local reset signal through an inverter gate, the second input being coupled to the first local reset signal;

a NOR gate, the NOR gate having two inputs and one output, the output of the first AND gate and second AND gate being coupled to one input of the NOR gate respectively;

and wherein the output of the NOR gate being the enable signal of the first logic means.

3. The circuit in accordance with the claim 2, wherein the second logic means comprising:

an AND gate, the AND gate having two inputs and one output, the input of the AND gate being coupled to the second local reset signal and system data signal respectively;

and wherein the output being the local data signal of the second logic means.

4. The circuit in accordance with the claim 2, wherein the time delay td1 is less than the time delay td2.

5. The circuit in accordance with the claim 2, wherein the system reset signal, first local reset signal and second local reset signal being active low.

6. The circuit in accordance with the claim 5, the system write signal being active low.

7. The circuit in accordance with the claim 5, wherein the second local reset signal becoming nonactive before the system write signal becomes active.

8. The circuit in accordance with the claim 7, wherein the enable signal being active low.

9. The circuit in accordance with the claim 2, wherein the time delay td1 being substantially zero.

* * * * *